United States Patent
Krebser et al.

[19]

[11] Patent Number: 5,979,955
[45] Date of Patent: Nov. 9, 1999

[54] VERTICAL EXTRACTION TOOL FOR SEMICONDUCTOR PACKAGED DEVICES

[75] Inventors: Mary Jane Krebser; Jeffrey Kaskey, both of Foster City; Vernon Bollesen, Milpitas; James Jones, Saratoga, all of Calif.

[73] Assignee: Sun Microsystems, Inc., Palo Alto, Calif.

[21] Appl. No.: 09/022,444

[22] Filed: Feb. 12, 1998

[51] Int. Cl.[6] .................................................. B25J 15/10
[52] U.S. Cl. .............................. 294/16; 29/764; 294/28; 294/115
[58] Field of Search ............................ 294/15, 16, 27.1, 294/28, 31.1, 103.1, 104, 106, 115, 116; 29/758, 764; 118/500, 503

[56] References Cited

U.S. PATENT DOCUMENTS

| | | | |
|---|---|---|---|
| 1,351,493 | 8/1920 | Sigmond | 294/106 |
| 1,592,286 | 7/1926 | Rymarz | 294/28 |
| 2,229,800 | 1/1941 | Dean | 294/106 |
| 3,181,906 | 5/1965 | De Rose et al. | 294/16 X |
| 3,284,124 | 11/1966 | Kuehn | 294/16 |
| 4,726,615 | 2/1988 | Goldberg | 294/16 |

*Primary Examiner*—Johnny D. Cherry
*Attorney, Agent, or Firm*—Jones Volentine, LLP

[57] ABSTRACT

An extraction tool for extracting a module that is detachably connected to a mounting substrate includes a fixed plate that is vertically supported over the module to be extracted. A movable plate is arranged below the fixed plate and a screw is inserted in central openings in each of the fixed and movable plates. A pair of vertically extending side panels are connected at one edge by a hinge to opposite sides of the movable plate. The opposite edge of the respective side panels are used to grip the module to be extracted. A spring biases the side panels inwardly. A rotatable handle is arranged above the fixed plate and is connected to the screw. Lateral rotation of the handle causes a corresponding axial rotation of the screw for moving the movable plate in a vertical direction. The precise vertical movement of the plate also causes vertical movement of the side panels gripping the module which ensures that the module is extracted without any side-to-side or twisting motion, thereby avoiding damage to the connectors.

11 Claims, 3 Drawing Sheets

VERTICAL EXTRACTION TOOL FOR SEMICONDUCTOR PACKAGED DEVICES

BACKGROUND OF THE INVENTION

1. Field of the Invention

The present invention generally relates to extracting modules or other semiconductor packaged devices from a motherboard or substrate, and more particularly, to an apparatus that allows for the vertical removal of the modules or packaged devices without any torque or twisting motion being applied to the module or package.

2. Description of the Related Art

The design and development of more complex and higher-functionality semiconductor chips continues unabated. Integrated circuit density has progressed from Small-scale integration (SSI) and Large-scale integration (LSI), to Very large-scale integration (VLSI) and Very high-speed integration (VHSI), and now to Ultra large-scale integration (ULSI). With each progressive generation, the number of transistors, gates, and conductive paths per square centimeter increases, and clock speeds have increased as well.

With the development of such high performance application-specific integrated circuits (ASICs), memory and high-speed chips, the need for denser packaging and interconnection schemes capable of eliciting the full performance of the chips has increased accordingly. It has become clear that the packaging and interconnection of groups of semiconductor chips into modules offers advantages in packaging density, electronic product performance and scalability. The modules are in turn generally attached, by pin connectors or other conventional connection means, to a motherboard, daughterboard, or the like depending on the sub-assembly, system, or product application.

Despite the high reliability of present day integrated circuits and modules, failures still occur and the modules may have to be extracted or removed from the board and reworked. Also, a module may need to be extracted so that it can be replaced with an upgraded or next generation module. Moreover, the modules may be repeatedly extracted and replaced during the developing, testing and manufacturing phases of a particular assembly or product.

Since the central processor unit (CPU) chip is not placed on the motherboard, hundreds of data and power lines need to be fed from the module to the motherboard. This in turn requires denser connections which are tighter and more difficult to install. Moreover, because the surface area of such modules is generally larger than a typical semiconductor chip, a greater force is required to remove them. The higher packaging density in present systems also makes it harder to remove the module without damaging adjacent modules or circuits.

The conventional extraction process is usually accomplished by applying a lateral shear ("rocking") force, for pin connections for example, or a twisting force for other types of connections such as adhesives. In particular, for the pin-type connections, which are designed to be reused, such a side-to-side rocking motion damages both the module connector containing the pins and the board connector into which the pins must be inserted.

Accordingly, there exists a need for an extraction tool that is capable of vertically removing the module without a rocking or twisting motion, and which does not damage the module or board connections, nor adjacent modules or chips.

SUMMARY OF THE INVENTION

The present invention is therefore directed to an extraction tool for a module that substantially overcomes one or more of the problems due to the limitations and disadvantages of the conventional art.

In general, the present invention provides an extraction tool for vertically extracting a module that is detachably connected to a mounting substrate. The extraction tool includes a fixed plate that is vertically supported over the module to be extracted. A movable plate is arranged below the fixed plate and a screw is inserted in respective central openings in each of the fixed and movable plates. A pair of vertically extending and inwardly biased side panels are connected along one edge by a hinge to opposite sides of the movable plate. The opposite edges of the side panels are used to grip the module to be extracted. A rotatable handle is arranged above the fixed plate and is connected to the screw. Lateral rotation of the handle causes a corresponding axial rotation of the screw which in turn causes the movable plate to move in a vertical direction.

The vertical movement of the movable plate also causes vertical movement of the attached side panels that are gripping the module. This precise vertical movement ensures that the module is extracted without any side-to-side or twisting motion, thereby avoiding damage to the connectors.

BRIEF DESCRIPTION OF THE DRAWINGS

The foregoing and other objects, aspects and advantages will be described with reference to the drawings, in which.

DETAILED DESCRIPTION OF THE PREFERRED EMBODIMENTS

While the present invention is described herein with reference to illustrative embodiments for particular applications, it should be understood that the present invention is not limited thereto. Those having ordinary skill in the art and access to the teachings provided herein will recognize additional modifications, applications, and embodiments within the scope thereof and additional fields in which the invention would be of significant utility without undue experimentation.

Figure 1:
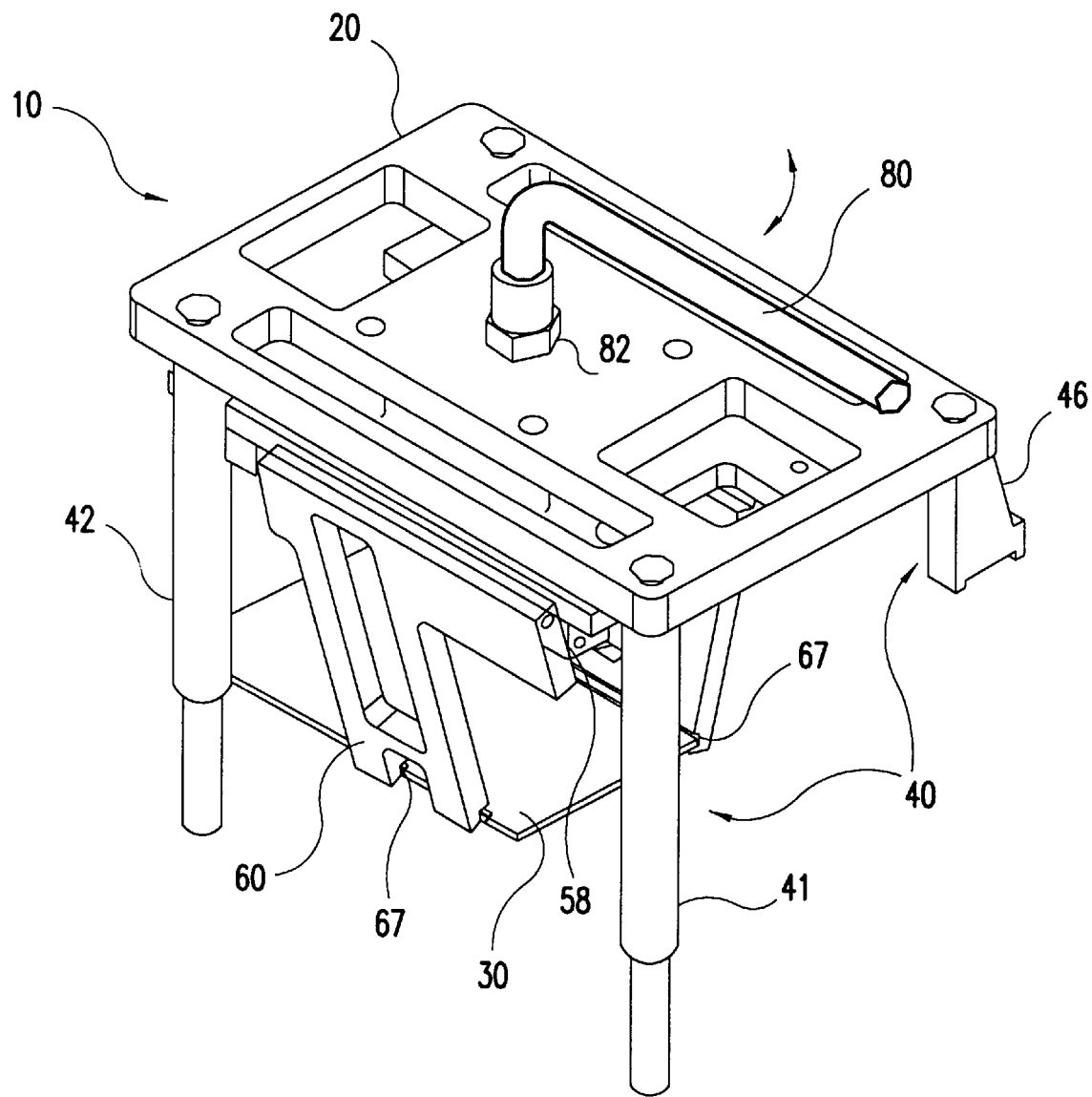
FIG. 1 is a perspective view of an extraction tool in accordance with the present invention that is contacting a module to be extracted.

FIG. 1 is a perspective view of the extraction tool 10 of the present invention. The extraction tool 10 can be used for extracting any module that is connected to a mounting substrate. Generally, the extraction tool 10 includes a fixed plate 20 that is vertically supported by a support structure 40 over a module 30 that is to be extracted. The support structure 40 will be described in greater detail later in the specification.

Figure 2:
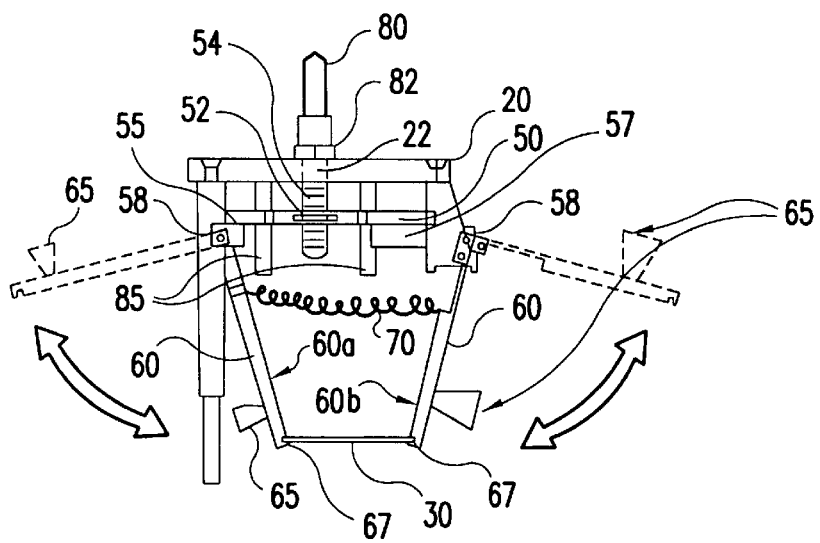
FIG. 2 is a side view of the extraction tool of FIG. 1.

As best seen in FIG. 2, a movable plate 50 is arranged below the fixed plate 20. Both the fixed plate 20 and moveable plate 50 have respective central openings, 22 and 52, that are vertically aligned. The central opening 52 is threaded to accommodate a screw 54 that is inserted in the opening. The screw 54 is of sufficient length to extend below the movable plate 50 and through the central opening 22 of the fixed plate 20. The central opening 22 of the fixed plate 20 is preferably threaded as well, although it need not be.

A pair of side panels 60 extend downwardly from the movable plate 50. Each of the side panels 60 is connected along one edge to opposite edges 55 and 57 of the movable plate 50 by a hinge mechanism 58. The hinge mechanism 58 may be any conventional hinge device. A coiled spring 70 or other elastic means is used to bias the side panels 60 inwardly so as to securely grip the module 30. As shown in FIG. 2, the coiled spring 70 is attached at one end to an inner surface 60a of one of the side panels 60 and is attached at another end to an inner surface 60b of the other of the side panels 60 to inwardly bias the side panels. Other methods of inwardly biasing the side panels 60 are contemplated within the scope of the present invention. For example, the hinge mechanism 58 itself may contain a spring or other elastic means. If the hinge is biased inwardly, the side panels attached to the hinge would also be biased inwardly. Also, a separate spring can be provided to connect one of the side panels to an interior portion of the support structure 40, or the lower surface of the fixed plate 20, to provide an inward bias. Likewise, a corresponding spring would be provided to connect the other side panel to an interior portion of the support structure 40 or the lower surface of the fixed plate 20.

Figure 3:
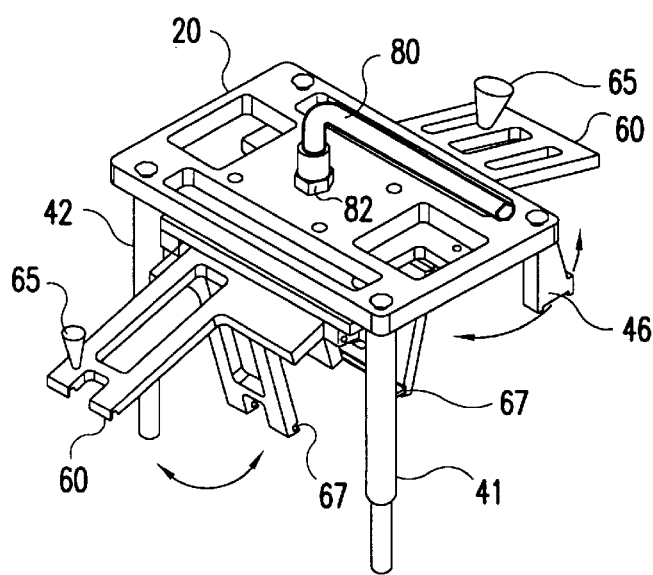
FIG. 3 is a perspective view of the extraction tool of the present invention illustrating the operation of the side panels.
Figure 4:
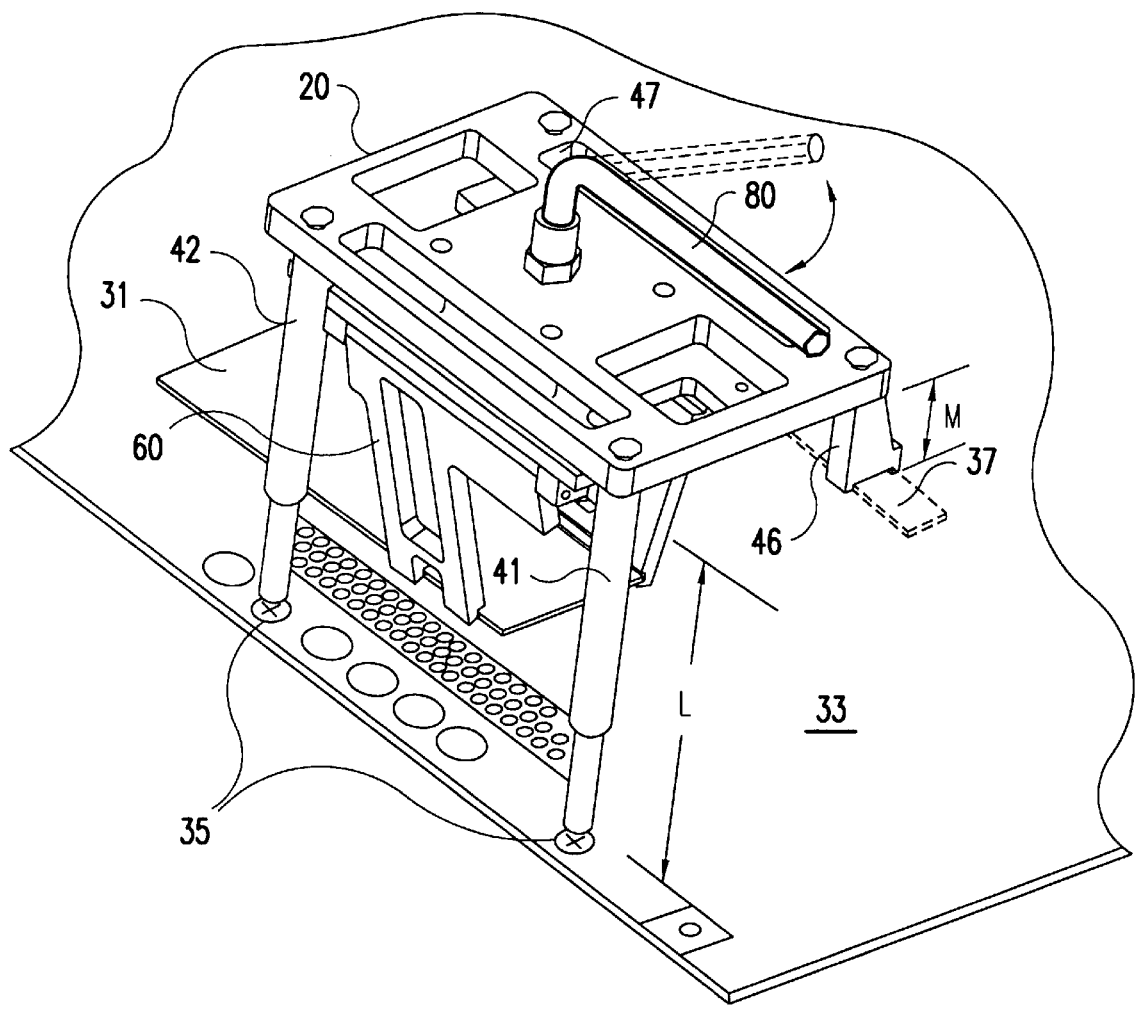
FIG. 4 is a perspective view of the extraction tool of the present invention, illustrating the support mounts of an exemplary support structure for contacting a module connected to a designated motherboard.

FIG. 2 and FIG. 3 illustrate knobs 65 attached to each of the side panels 60 for pulling the side panels away from each other. The side panels 60 would be pulled away from each other in the direction of the arrows to either initially grip the module 30, or to release the module 30 after it has been extracted from the mounting substrate. Each of the side panels 60 includes a groove 67 formed at an edge opposite to the hinged edge of the side panel for contacting the opposing edges of the module 30 to be extracted. The inward biasing of the side panels 60 ensures that the module 30 is securely fixed or clamped inside the grooves 67 to facilitate the vertical extraction of the module 30 using the handle 80 as described in greater detail immediately below. The grooves are preferably coated with a stick-free and scratch-resistant coating, such as TEFLON, to protect the module 30 while it is being extracted.

As shown in FIG. 1 through FIG. 4, a rotatable handle 80 is arranged above the fixed plate 20 and is connected to the screw 54 using a handle nut 82 or other connecting means. The handle nut 82 would always be flush to the upper surface of the plate 20. Lateral rotation of the handle 80, shown by the arrows in FIG. 1 and FIG. 4, causes a corresponding axial rotation of the screw 54 within the threaded central opening 52. The rotation of the screw 54 within the threaded central opening 52 causes the movable plate 50 to move up or down in a vertical direction along the screw threads. For example, clockwise lateral rotation of the handle 80 would move the movable plate 50 in an upward vertical direction and a counter clockwise lateral rotation of the handle 80 would move the movable plate 50 in a downward vertical direction.

When the side panels 60 are properly clamping the module 30, the vertical movement of the movable plate 50 also causes vertical movement of the attached side panels 60 that are gripping the module 30, which ensures that the module 30 is extracted without any side-to-side or twisting motion, thereby avoiding damage to the module and mounting substrate connectors.

As shown in FIG. 2, guide rods 85 can be further provided to ensure precise vertical movement of the movable plate 50. The guide rods 85 extend downwardly from the fixed plate 20 and through openings in the movable plate 50 for guiding the movable plate 50 in the upward and downward vertical directions.

Referring again to FIG. 4, there is shown a perspective view of the extraction tool of the present invention, illustrating an exemplary support structure 40 for removing an UltraSparc IIi module 31 (manufactured by Sun Microsystems) from its motherboard 33.

The fixed plate 20 is supported on one side by two cylindrically shaped legs 41, 42 having a length L. On the other side, the fixed plate 20 is supported by two rectangularly shaped legs 46, 47 having a length M. Note that the lengths and shapes of the legs are different. This is because the lengths and shapes of the legs 41, 42 and 46, 47 are chosen to correspond to known mounting locations on the motherboard 33. For example, the distal ends of the cylindrically shaped legs 41, 42 rest on screws 35 which are used to mount the motherboard 35 to the chassis (not shown). The distal ends of the rectangularly shaped legs 46, 47 rest on a bracket 37 used to stiffen the chassis.

One of ordinary skill in the art could readily adapt the support structure 40 of the present invention to a particular configuration for use in extracting different modules from different mounting substrates. The integrated operation of the fixed plate, movable plate, screw, side panels and handle of the present invention would be essentially the same.

Also, while the extraction tool 10 was described above with general reference to a removing a module that is mechanically connected to a mounting substrate via a mechanical pin connection, the present invention is equally applicable to removing modules or chips of any type, regardless of the connection scheme. Of course, one of ordinary skill in the art would understand that for modules or chips attached by solder, adhesive and the like, a thermal treatment to soften or weaken the connection between the module and mounting substrate would be used in combination with the mechanical apparatus of the present invention. As disclosed above, the present invention provides numerous advantageous over conventional extraction tools. The precise vertical movement of the plate causes a corresponding vertical movement of the attached side panels that are gripping the module which ensures that the module is extracted without any side-to-side or twisting motion, thereby avoiding damage to the connectors. Also, the configuration of the support structure allows for the extraction of the module in a confined space without damaging adjacent modules or chips. Moreover, the extraction tool may be adapted to extract any module or chip regardless of the connection scheme of the module or chip to the mounting substrate.

Although preferred embodiments of the present invention have been described in detail herein above, it should be clearly understood that many variations and/or modifications of the basic inventive concepts herein taught, which may appear to those skilled in the art, will still fall within the spirit and scope of the present invention as defined in the appended claims and their equivalents.

Having thus described our invention, what we claim as new and desire to secure by Letters Patent is as follows:

1. An extraction tool for extracting a module detachably connected to a mounting substrate, said extraction tool comprising:

a support structure comprising a fixed plate having a central opening and means for vertically supporting said fixed plate;

a movable plate arranged below said fixed plate and having a threaded central opening in vertical alignment with said central opening of said fixed plate;

a pair of vertically extending side panels, each of said side panels being connected at one edge by a hinge to a respective side of said movable plate;

an elastic means for biasing said side panels inwardly;

a screw inserted through said threaded central opening and extending through said central opening of said fixed plate; and a rotatable handle arranged above said fixed plate and connected to said screw, wherein lateral rotation of said handle causes a corresponding axial rotation of said screw for moving said movable plate in a vertical direction.

2. The extraction tool of claim 1, wherein each of said side panels includes a groove formed at an edge opposite to said hinged edge, said grooves being capable of contacting opposing edges of a module to be extracted.

3. The extraction tool of claim 2, further comprising a knob attached to each of said side panels for pulling said side panels away from each other.

4. The extraction tool of claim 2, further comprising guide rods extending from said fixed plate and through openings in said movable plate for guiding said movable plate in said vertical direction.

5. The extraction tool of claim 4, wherein said elastic means comprises a coiled spring attached at one end to an inner surface of one of said side panels and attached at another end to an inner surface of the other of said side panels.

6. The extraction tool of claim 5, wherein said means for vertically supporting said fixed plate comprises a first leg and a second leg of a first length extending downwardly from a side of said fixed plate, and a third leg and a fourth leg of a second length extending downwardly from an opposite side of said fixed plate.

7. The extraction tool of claim 6, wherein said first length and said second length are different.

8. The extraction tool of claim 7, wherein said first leg and said second leg are cylindrically shaped, each being connected at one end to said fixed plate and having a second end contacting a fastening portion of said mounting substrate.

9. The extraction tool of claim 8, wherein said third leg and said fourth leg are rectangularly shaped, each being connected at one end to said fixed plate and having a second end contacting a longitudinally extending bracket portion of said mounting substrate.

10. The extraction tool of claim 1, wherein clockwise lateral rotation of said handle moves said movable plate in an upward vertical direction and counter clockwise lateral rotation of said handle moves said movable plate in a downward vertical direction.

11. An extraction tool for extracting a module detachably connected to a mounting substrate, said extraction tool comprising:

a support structure comprising a fixed plate having a central opening, a first leg and a second leg of a first length extending downwardly from a side of said fixed plate, wherein said first leg and said second leg are cylindrically shaped, each being connected at one end to said fixed plate and having a second end contacting a fastening portion of said mounting substrate, and a third leg and a fourth leg of a second length extending downwardly from an opposite side of said fixed plate, wherein said third leg and said fourth leg are rectangularly shaped, each being connected at one end to said fixed plate and having a second end contacting a longitudinally extending bracket portion of said mounting substrate, and wherein said first length and said second length are different;

a movable plate arranged below said fixed plate and having a threaded central opening in vertical alignment with said central opening of said fixed plate;

a pair of vertically extending side panels, each of said side panels being connected at one edge by a hinge to a respective side of said movable plate, wherein each of said side panels includes a groove formed at an edge opposite to said hinged edge, said grooves being capable of contacting opposing edges of a module to be extracted, and including a knob attached to each of said side panels for pulling said side panels away from each other;

a coiled spring attached at one end to an inner surface of one of said side panels and attached at another end to an inner surface of the other of said side panels for biasing said side panels inwardly;

a screw inserted through said threaded central opening and extending through said central opening of said fixed plate;

a rotatable handle arranged above said fixed plate and connected to said screw, wherein clockwise lateral rotation of said handle moves said movable plate in an upward vertical direction and counter clockwise lateral rotation of said handle moves said movable plate in a downward vertical direction; and guide rods extending from said fixed plate and through openings in said movable plate for guiding said movable plate in said upward and downward vertical directions.

* * * * *